US011227701B2

(12) United States Patent
Cho et al.

(10) Patent No.: US 11,227,701 B2
(45) Date of Patent: *Jan. 18, 2022

(54) FLEXIBLE ELECTRODE AND METHOD FOR MANUFACTURING THE SAME

(71) Applicant: Korea University Research and Business Foundation, Seoul (KR)

(72) Inventors: Jinhan Cho, Seoul (KR); Yongmin Ko, Goyang-si (KR)

(73) Assignee: Korea University Research and Business Foundation, Seoul (KR)

( * ) Notice: Subject to any disclaimer, the term of this patent is extended or adjusted under 35 U.S.C. 154(b) by 255 days.

This patent is subject to a terminal disclaimer.

(21) Appl. No.: 16/345,511

(22) PCT Filed: Oct. 17, 2017

(86) PCT No.: PCT/KR2017/011462
§ 371 (c)(1),
(2) Date: Apr. 26, 2019

(87) PCT Pub. No.: WO2018/080083
PCT Pub. Date: May 3, 2018

(65) Prior Publication Data
US 2019/0279782 A1    Sep. 12, 2019

(30) Foreign Application Priority Data
Oct. 28, 2016  (KR) .......... 10-2016-0141758

(51) Int. Cl.
| H01B 1/22 | (2006.01) |
| H01B 5/14 | (2006.01) |
| H01B 13/00 | (2006.01) |
| H01B 1/02 | (2006.01) |
| H01B 3/30 | (2006.01) |
| H01L 31/0224 | (2006.01) |
| H01L 31/18 | (2006.01) |
| H01B 7/04 | (2006.01) |

(52) U.S. Cl.
CPC .......... *H01B 1/22* (2013.01); *H01B 1/02* (2013.01); *H01B 3/30* (2013.01); *H01B 5/14* (2013.01); *H01B 13/0026* (2013.01); *H01B 13/0036* (2013.01); *H01B 7/04* (2013.01); *H01L 31/022466* (2013.01); *H01L 31/1884* (2013.01)

(58) Field of Classification Search
None
See application file for complete search history.

(56) References Cited

U.S. PATENT DOCUMENTS

| 8,206,803 | B2 * | 6/2012 | Hong | ............... G11B 9/1472 |
| | | | | 428/64.1 |
| 9,735,295 | B2 | 8/2017 | McKay et al. | |
| 2008/0157066 | A1 | 7/2008 | Joo et al. | |
| 2014/0371562 | A1 | 12/2014 | Lee et al. | |
| 2015/0174613 | A1 | 6/2015 | Kim | |
| 2016/0233357 | A1 | 8/2016 | Lee et al. | |
| 2020/0343016 | A1 * | 10/2020 | Cho | ................. C25D 7/00 |

FOREIGN PATENT DOCUMENTS

| CN | 103420357 A | 12/2013 |
| CN | 103732797 A | 4/2014 |
| CN | 104724668 A | 6/2015 |
| CN | 105331054 A | 2/2016 |
| JP | 2008-166710 A | 7/2008 |
| JP | 2012-216722 | * 11/2012 |
| KR | 10-2009-0069886 A | 7/2009 |
| KR | 10-2009-0126356 A | 12/2009 |
| KR | 10-2015-0072291 A | 6/2015 |
| KR | 10-2016-0061346 A | 5/2016 |

OTHER PUBLICATIONS

Machine translation of JP 2012-216722, published on Nov. 8, 2012 (Year: 2012).*
Korean Office Action for 10-2016-0141758 dated Nov. 17, 2017.
International Search Report for PCT/KR201/011462 dated Feb. 8, 2018 (PCT/ISA/210).
Communication dated Nov. 28, 2019, issued by the Chinese Patent Office in counterpart Chinese Patent Application No. 201780066747.9.

* cited by examiner

*Primary Examiner* — Anca Eoff
(74) *Attorney, Agent, or Firm* — Sughrue Mion, PLLC

(57) ABSTRACT

The present invention relates to a flexible electrode and a method for manufacturing the same. According to an embodiment of the present invention, the flexible electrode includes a substrate 10, a bonding layer 20 formed by adsorbing an amino group (NH$_2$)-containing monomolecular material on the substrate 10, and a conductive layer 30 formed by coating metal nanoparticles 31 on the bonding layer 20.

13 Claims, 9 Drawing Sheets

[Fig. 1]
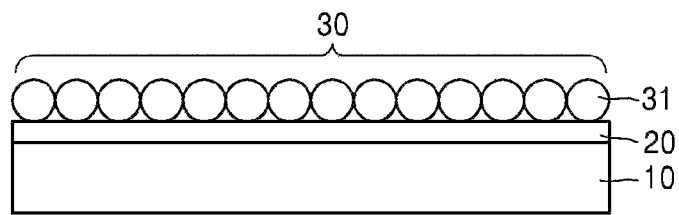

[Fig. 2]
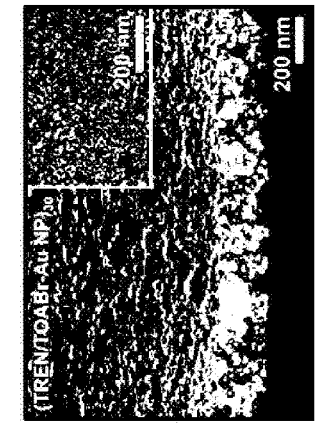
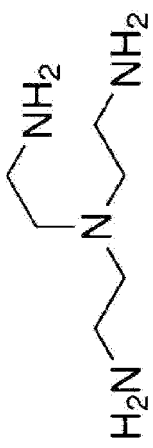
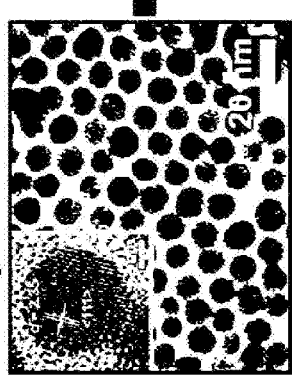

[Fig. 3]
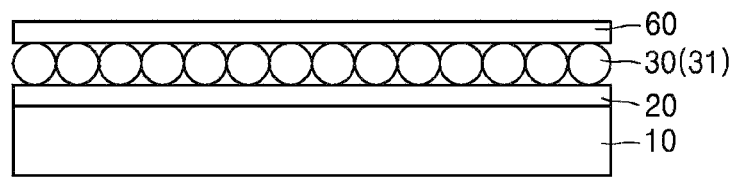
[Fig. 4]
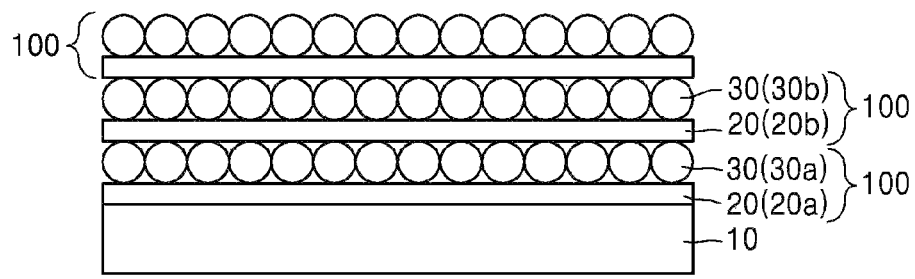
[Fig. 5]
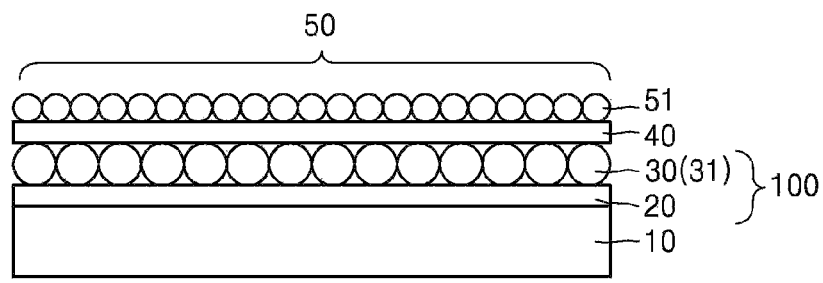

[Fig. 6]
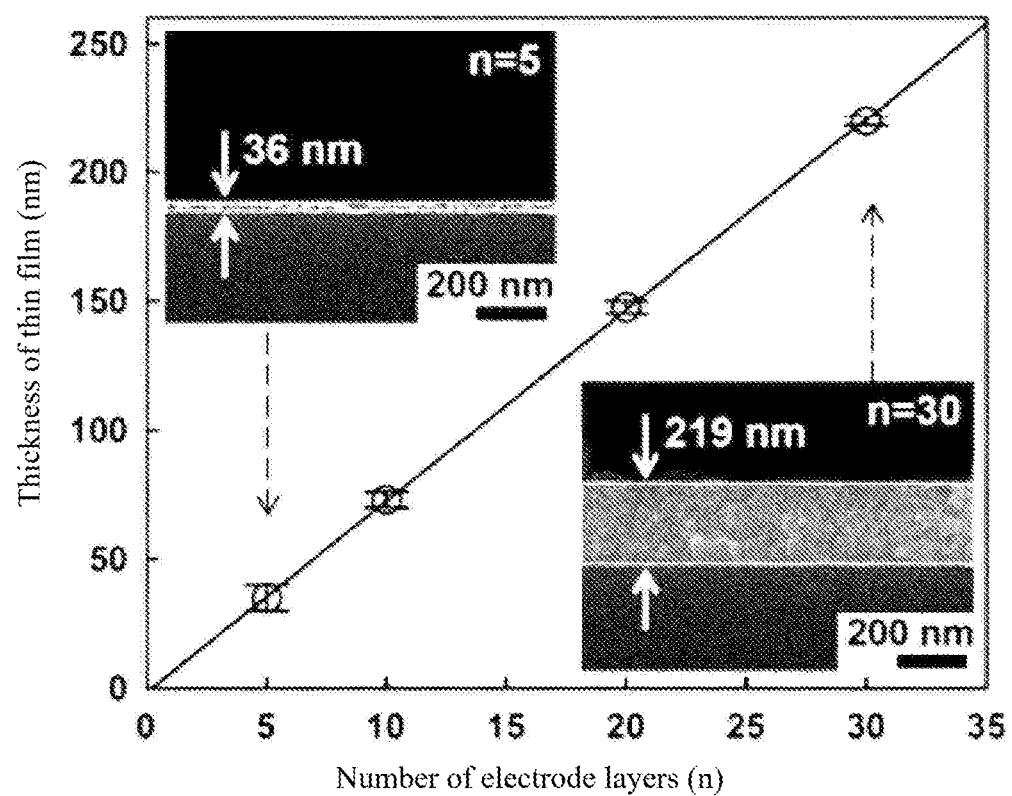

[Fig. 7]
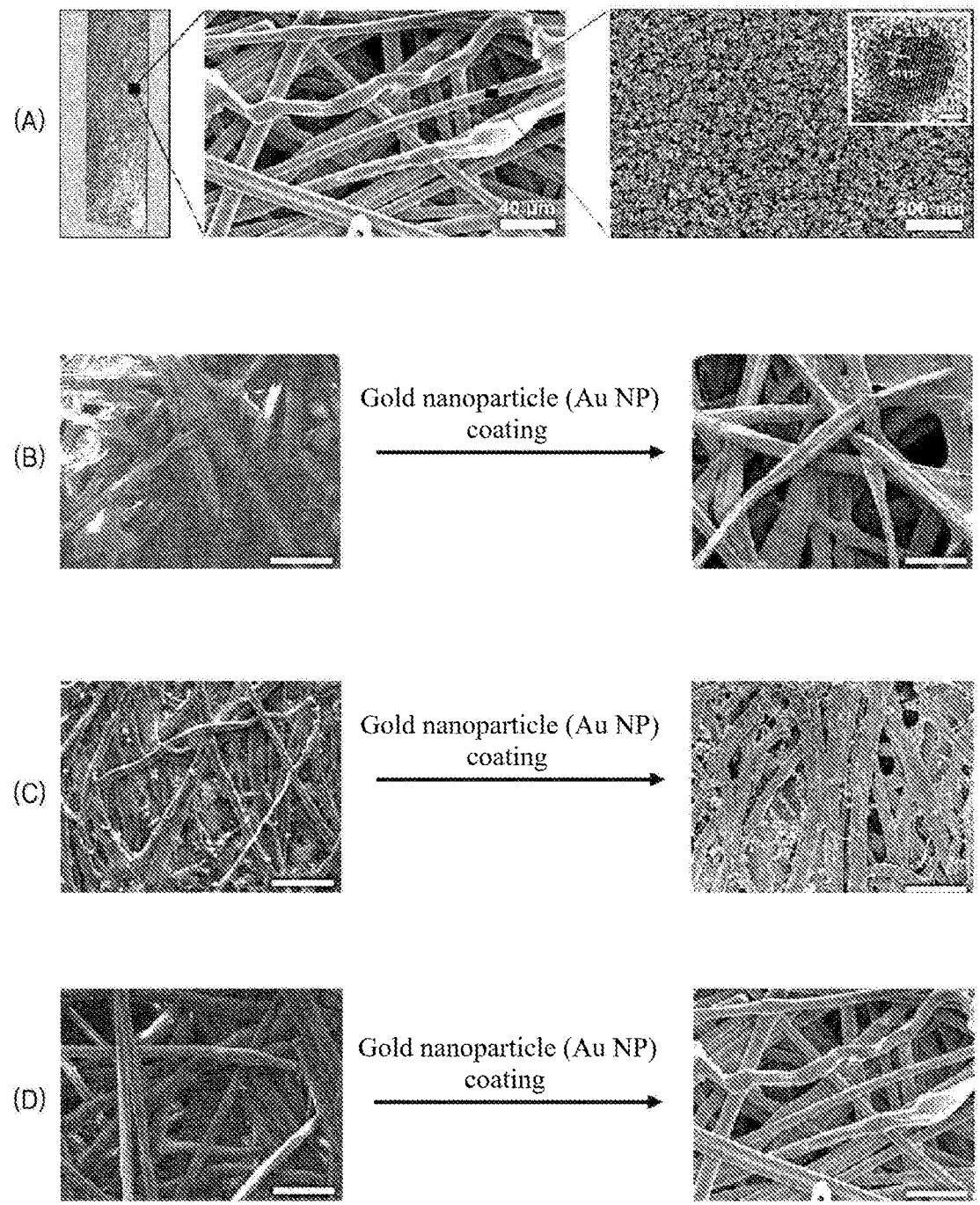

[Fig. 8]
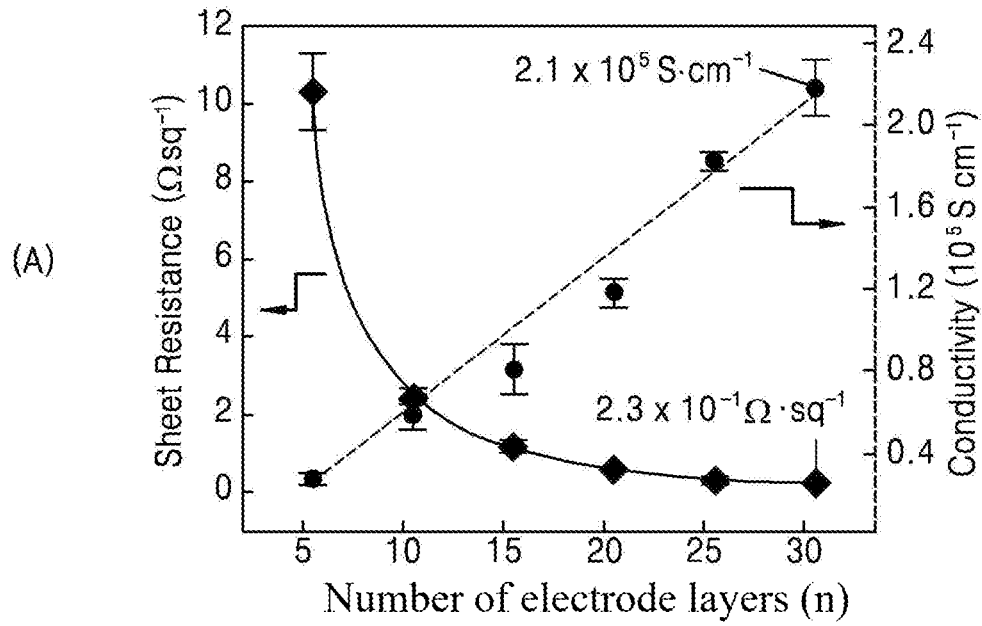
(A)
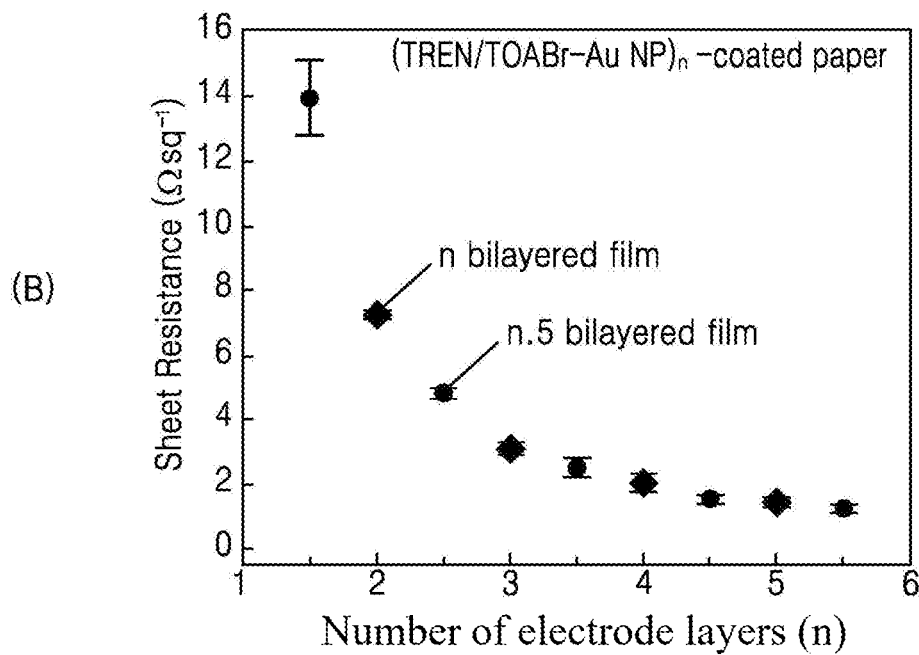
(B)

[Fig. 9]
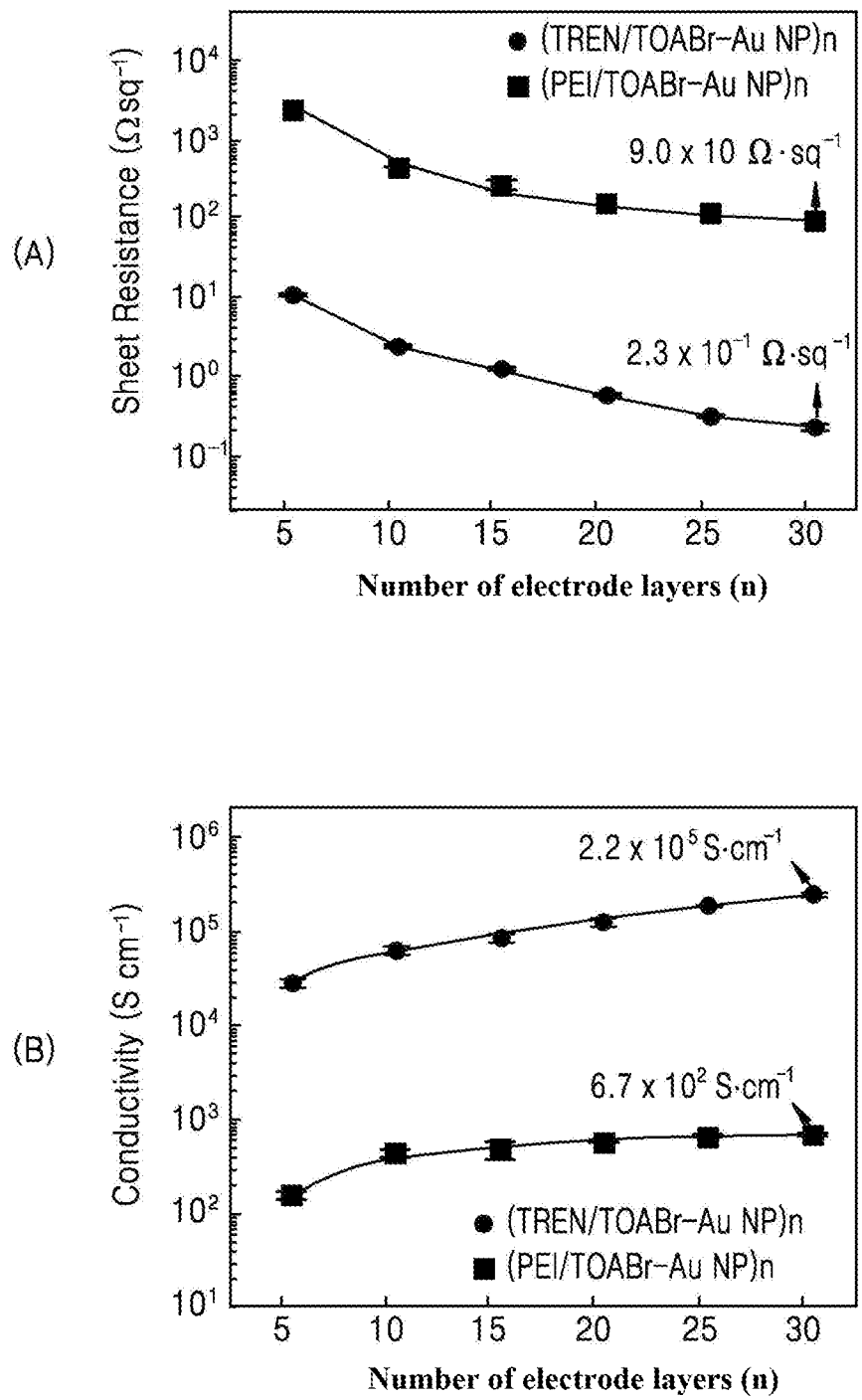

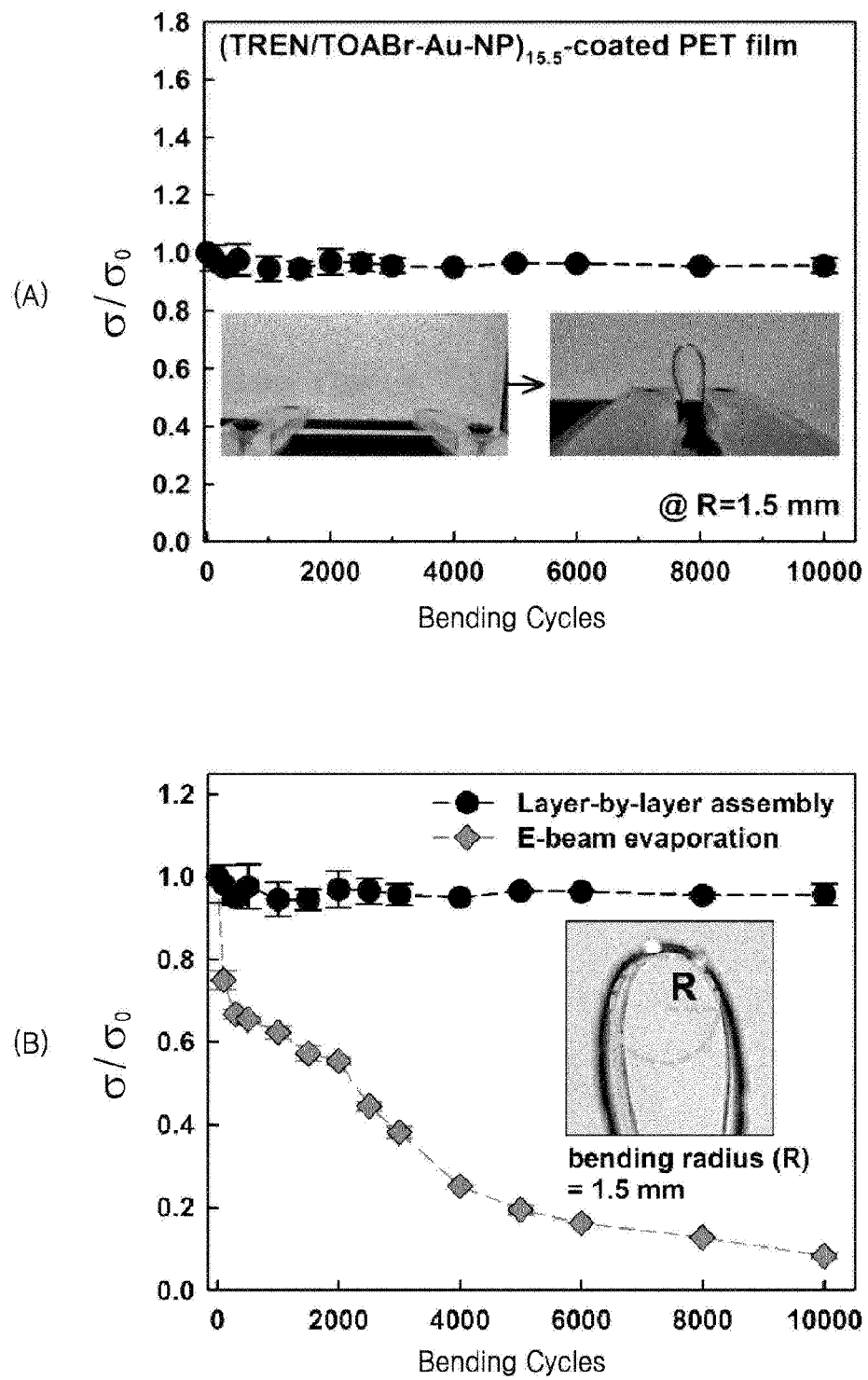
[Fig. 10]

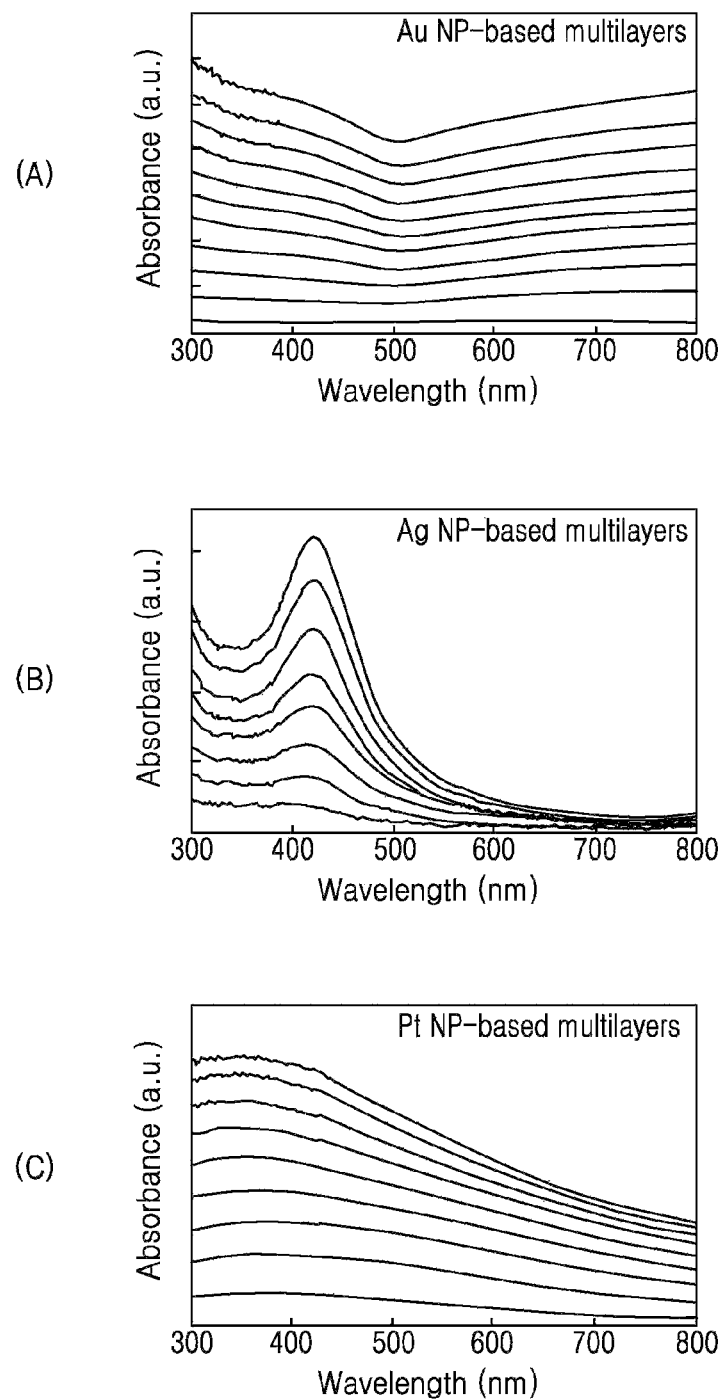
[Fig. 11]

FLEXIBLE ELECTRODE AND METHOD FOR MANUFACTURING THE SAME

CROSS REFERENCE TO RELATED APPLICATIONS

This application is a National Stage of International Application No. PCT/KR2017/011462 filed Oct. 17, 2017, claiming priority based on Korean Patent Application No. 10-2016-0141758, filed Oct. 28, 2016.

TECHNICAL FIELD

The present invention relates to a flexible electrode and a method for manufacturing the same.

BACKGROUND ART

With the recent advances in nanotechnology, information technology, and display technology, there has been an increasing need for mobile electronic devices that are easy to carry and are portable. Particularly, flexible, lightweight, and easy-to-carry electronic devices have received attention in various fields, including displays, transistors, touch panels, and solar cells. Electrodes suitable for fabricating such flexible electronic devices should be able to maintain their electrical conductivity even under various mechanical stresses such as bending, twisting, and stretching. Flexible electrodes are manufactured by forming a highly electrically conductive electrode material on a flexible substrate. Flexible electrodes are applicable to not only flexible devices but also antistatic films, antennas, and optical filters depending on their sheet resistance. Due to these advantages, flexible electrodes have been well-established as key components in information, electronic, and energy fields.

Conductive oxides, carbon nanotubes, graphene, and polymer conductors are currently known as the most widely used materials for flexible electrodes. Indium tin oxide (ITO) is a representative flexible electrode material, as disclosed in KR2009-0069886. ITO is a kind of transparent conductive oxide and is most widely used in flexible electrodes due to its high transmittance and conductivity.

However, the limited reserves of indium, a major constituent element of ITO, are responsible for the increasing manufacturing costs of flexible electrodes, resulting in low competitiveness in the market. ITO electrodes are apt to crack, resulting in deterioration of their electrode characteristics, because of their low resistance to substrate bending and warpage. That is, the low mechanical strength of ITO electrodes leads to poor electrical properties. The bonding of electrodes to lightweight and human-friendly fabric materials is of particular importance for the development of wearable devices. ITO electrodes are not suitable for this need.

Thus, there is an urgent need for a solution to the problems of conventional flexible electrodes.

DETAILED DESCRIPTION OF THE INVENTION

Problems to be Solved by the Invention

The present invention has been made in an effort to solve the problems of the prior art and intends to provide a flexible electrode manufactured by adsorbing highly electrically conductive metal nanoparticles on a human-friendly and highly flexible substrate using an amino group ($NH_2$)-containing monomolecular material, achieving high electrical/mechanical strength.

Means for Solving the Problems

One aspect of the present invention provides a flexible electrode including a substrate, a bonding layer formed by adsorbing an amino group ($NH_2$)-containing monomolecular material on the substrate, and a conductive layer formed by coating metal nanoparticles on the bonding layer.

In the flexible electrode of the present invention, the substrate is made of at least one material selected from polyesters, celluloses, nylons, and acrylic fibers.

In the flexible electrode of the present invention, the bonding layer and the conductive layer form an electrode layer and one or more electrode layers are further provided.

In the flexible electrode of the present invention, the amino group ($NH_2$)-containing monomolecular material is tris(2-aminoethyl)amine (TREN).

In the flexible electrode of the present invention, the metal nanoparticles are nanoparticles of at least one metal selected from Pt, Au, Ag, Al, and Cu.

The flexible electrode of the present invention further includes an adsorption layer formed by adsorbing an amino group-containing monomolecular material on the conductive layer and an energy storage layer formed by coating transition metal oxide nanoparticles on the adsorption layer.

In the flexible electrode of the present invention, the transition metal oxide nanoparticles are nanoparticles of at least one transition metal oxide selected from $Fe_3O_4$, $MnO_2$, $TiO_2$, $WO_3$, $V_2O_5$, and $TiO_2$.

The flexible electrode of the present invention further includes a cover layer formed by adsorbing an amino group-containing monomolecular material on the conductive layer.

Another aspect of the present invention provides a method for manufacturing a flexible electrode, including a) immersing a substrate in an organic solvent including an amino group ($NH_2$)-containing monomolecular material dispersed therein to adsorb the amino group-containing monomolecular material on the substrate, and b) immersing the substrate adsorbed by the amino group-containing monomolecular material in a nonpolar solvent including metal nanoparticles dispersed therein to form a conductive layer adsorbed by the metal nanoparticles on the substrate.

The method of the present invention further includes c) immersing the substrate formed with the conductive layer in the organic solvent including the amino group-containing monomolecular material dispersed therein to adsorb the amino group-containing monomolecular material on the conductive layer and d) immersing the substrate adsorbed by the amino group-containing monomolecular material in the nonpolar solvent including the metal nanoparticles dispersed therein to form another conductive layer.

The method of the present invention further includes c) immersing the substrate formed with the conductive layer in the organic solvent including the amino group-containing monomolecular material dispersed therein to adsorb the amino group-containing monomolecular material on the conductive layer and d) immersing the substrate adsorbed by the amino group-containing monomolecular material in a nonpolar solvent including transition metal oxide nanoparticles dispersed therein to adsorb the transition metal oxide nanoparticles on the conductive layer.

In the method of the present invention, the substrate is made of at least one material selected from polyesters, celluloses, nylons, and acrylic fibers.

In the method of the present invention, the amino group ($NH_2$)-containing monomolecular material includes tris(2-aminoethyl)amine (TREN).

In the method of the present invention, the metal nanoparticles are nanoparticles of at least one metal selected from Pt, Au, Ag, Al, and Cu.

In the method of the present invention, the transition metal oxide nanoparticles are nanoparticles of at least one transition metal oxide selected from $Fe_3O_4$, $MnO_2$, $TiO_2$, $WO_3$, $V_2O_5$, and $TiO_2$.

The features and advantages of the present invention will become apparent from the following description with reference to the accompanying drawings.

Prior to the detailed description of the invention, it should be understood that the terms and words used in the specification and the claims are not to be construed as having common and dictionary meanings but are construed as having meanings and concepts corresponding to the technical spirit of the present invention in view of the principle that the inventor can define properly the concept of the terms and words in order to describe his/her invention with the best method.

Effects of the Invention

The flexible electrode of the present invention is manufactured by adsorbing highly electrically conductive metal nanoparticles on a human-friendly and highly flexible substrate using an amino group ($NH_2$)-containing monomolecular material to form one or more conductive layers, achieving high electrical/mechanical strength and good processability.

In addition, the method of the present invention ensures high bonding strength between the particles and the presence of many pores in the flexible electrode. Therefore, when the flexible electrode is used as a current collector of an energy storage device, high ionic mobility and driving stability of the energy storage device can be ensured.

Furthermore, the flexible electrode of the present invention can be applied to not only energy storage devices but also various types of electrical devices where light weight and high flexibility are needed. Moreover, the flexible electrode of the present invention can be manufactured in a simple manner by a solution process irrespective of its size and shape.

BRIEF DESCRIPTION OF THE DRAWINGS

FIG. 1 is a cross-sectional view illustrating a flexible electrode according to a first embodiment of the present invention.

FIG. 2 is a SEM image of an electrode layer of the flexible electrode illustrated in FIG. 1.

FIG. 3 is a cross-sectional view illustrating a flexible electrode according to a second embodiment of the present invention.

FIG. 4 is a cross-sectional view illustrating a flexible electrode according to a third embodiment of the present invention.

FIG. 5 is a cross-sectional view illustrating a flexible electrode according to a fourth embodiment of the present invention.

FIG. 6 shows the thicknesses of thin films with varying numbers of electrode layers in flexible electrodes according to exemplary embodiments of the present invention.

FIG. 7 shows SEM images of thin films coated on different substrates in flexible electrodes according to exemplary embodiments of the present invention.

FIG. 8 shows the sheet resistances of flexible electrodes according to exemplary embodiments of the present invention with varying numbers of electrode layers.

FIG. 9 shows the electrical properties of flexible electrodes according to exemplary embodiments of the present invention with increasing electrode number.

FIG. 10 shows the mechanical stability of flexible electrodes according to exemplary embodiments of the present invention against repeated bending.

FIG. 11 shows the UV-vis spectra absorbance values of conductive multilayers of flexible electrodes according to exemplary embodiments of the present invention.

BEST MODE FOR CARRYING OUT THE INVENTION

Other objects, advantages, and novel features of the invention will become more apparent from the following detailed description and preferred embodiments with reference to the appended drawings. In the drawings, the same elements are denoted by the same reference numerals even though they are depicted in different drawings. Although such terms as "first" and "second," etc. may be used to describe various elements, these elements should not be limited by above terms. These terms are used only to distinguish one element from another. In the description of the present invention, detailed explanations of related art are omitted when it is deemed that they may unnecessarily obscure the essence of the present invention.

Preferred embodiments of the present invention will now be described in detail with reference to the accompanying drawings.

FIG. 1 is a cross-sectional view illustrating a flexible electrode according to a first embodiment of the present invention and FIG. 2 is a SEM image of an electrode layer of the flexible electrode.

As illustrated in FIGS. 1 and 2, the flexible electrode includes a substrate 10, a bonding layer 20 formed by adsorbing an amino group ($NH_2$)-containing monomolecular material on the substrate 10, and a conductive layer 30 formed by coating metal nanoparticles 31 on the bonding layer 20.

Electrodes capable of maintaining their electrical conductivity even under various mechanical stresses (e.g., bending, twisting, and stretching) are required as key components of flexible electronic devices in various application fields, including displays, transistors, touch panels, and solar cells. Indium tin oxide (ITO), a kind of transparent conductive oxide, is predominantly used as an electrode material in conventional flexible electronic devices. ITO has high transmittance and conductivity but the limited reserves of indium, a major constituent element of ITO, are responsible for high manufacturing costs of flexible electrodes. Further, ITO has low resistance to bending and warpage, resulting in deterioration of mechanical properties. Moreover, ITO loses its electrical properties after repeated use. Thus, the present invention has been made in an effort to solve the problems of conventional flexible electrodes.

As described above, the flexible electrode of the present invention includes a substrate 10, a bonding layer 20, and a conductive layer 30. The substrate 10 needs to be highly flexible for use in a flexible electronic device. Particularly, the flexible substrate 10 may be made of a human-friendly material because the flexible electrode may also be used in a wearable device. Examples of suitable human-friendly materials include textile fibers, such as polyester, cellulose, nylon, acrylic fibers, and paper, which may be used alone or as a mixture of two or more thereof. The material for the substrate 10 is not necessarily limited to the above-described textile fibers and may be a plastic material (e.g., PET), quartz glass or a Si wafer depending on the type of an electronic device to which the flexible electrode is applied. The bonding layer 20 is formed on one surface of the substrate 10.

The bonding layer 20 arranged on the substrate 10 is formed by adsorbing an amino group ($NH_2$)-containing monomolecular material on the substrate 10. Here, the amino group-containing monomolecular material serves to immobilize metal nanoparticles 31 onto the substrate 10 due to its affinity for the metal nanoparticles 31. The metal nanoparticles 31 are materials for the formation of the conductive layer 30 and improve the electrical conductivity of the conductive layer 30. A typical metal has low resistance whereas a thin film composed of metal particles is insulated to some extent because the surface of the thin film is surrounded by long organic ligands of the metal particles. The amino group-containing monomolecular material replaces insulating organic ligands of the metal nanoparticles 31 to improve the bonding strength between the metal nanoparticles 31 and the electrical conductivity of the conductive layer 30.

The amino group-containing monomolecular material may be, for example, tris(2-aminoethyl)amine (TREN) that has the ability to immobilize the metal nanoparticles 31 and improve the electrical conductivity of the conductive layer 30. However, the monomolecular material is not necessarily limited to TREN.

The metal nanoparticles 31 are coated and dispersed on the bonding layer 20 to form the conductive layer 30 in the form of a thin film. The metal nanoparticles 31 are nanoparticles of at least one metal selected from Pt, Au, Ag, Al, and Cu. However, the material for the metal nanoparticles 31 is not necessarily limited to the above-mentioned metals. The electrical conductivity of the conductive layer 30 is determined by the kind of the metal. Depending on the kind of the metal, the conductive layer 30 may have high resistance compared to that of the bulk metal. As described above, however, the ligand replacement enhances the electrical conductivity of the conductive layer 30.

Overall, the flexible electrode of the present invention has a structure in which the highly electrically conductive metal nanoparticles 31 are adsorbed on the human-friendly and highly flexible substrate 10 using the amino group-containing monomolecular material to form the conductive layer 30, achieving improved electrical/mechanical properties.

FIG. 3 is a cross-sectional view illustrating a flexible electrode according to a second embodiment of the present invention.

As illustrated in FIG. 3, the flexible electrode may further include a cover layer 60 that improves the electrical properties of the conductive layer 30 and increases the stability of the flexible electrode in air. The cover layer 60 is formed by adsorbing an amino group-containing monomolecular material on the conductive layer 30. The amino group-containing monomolecular material of the cover layer 60 replaces surface ligands of the conductive layer 30 and is bound to the metal nanoparticles 31 to remove all surface ligands of the metal nanoparticles 31. As a result, the insulation properties of the conductive layer 30 induced by the ligands disappear so that the electrical properties of the conductive layer 30 can be effectively exhibited. In addition, the cover layer 60 covers the areas of the conductive layer 30 exposed to air to protect the conductive layer 30 from contact with air. That is, the formation of the cover layer 60 solves the oxidation and stability problems of the flexible electrode.

FIG. 4 is a cross-sectional view illustrating a flexible electrode according to a third embodiment of the present invention.

As illustrated in FIG. 4, the flexible electrode of the present invention includes a multilayer structure of two electrode layers 100, each of which includes a bonding layer 20 and a conductive layer 30 formed in this order on a substrate 10. The electrode layers 100 can be provided individually or in the form of a multilayer structure. When the electrode layers 100 have a multilayer structure, the bonding layers 20 and the conductive layers 30 are stacked alternately. Accordingly, the first bonding layer 201, the first conductive layer 30a, the second bonding layer 20b, and the second conductive layer 30b are arranged in this order on the substrate 10. As the number of the electrode layers 100 increases, the sheet resistance of the flexible electrode decreases and the electrical conductivity of the flexible electrode increases.

A cover layer 60 may be formed as the outermost layer of the multilayer structure of the electrode layers 100 at the most distant position from the substrate 10. The cover layer 60 is the same as that described in the second embodiment (see FIG. 3). The cover layer 60 protects the conductive layer 30 from exposure to air.

FIG. 5 is a cross-sectional view illustrating a flexible electrode according to a fourth embodiment of the present invention. The flexible electrode proposed in FIG. 5 is adapted for use in an energy storage device. The flexible electrode further includes an adsorption layer 40 and an energy storage layer 50. The adsorption layer 40 is formed by adsorbing an amino group-containing monomolecular material on an underlying conductive layer 30 and is thus suitable for immobilizing metal nanoparticles 31. The energy storage layer 50 is formed by coating transition metal oxide nanoparticles 51 on the adsorption layer 40. The formation of the energy storage layer 50 enables the use of the flexible electrode in an energy storage device such as a supercapacitor with high power density or a lithium ion battery with high energy capacity. High bonding strength between the particles is ensured and many pores are present in the flexible electrode. Therefore, when the flexible electrode is used in an energy storage device, high ionic mobility and mechanical stability of the energy storage device can be ensured. However, the use of the flexible electrode is not necessarily limited to energy storage devices. For example, the flexible electrode may be used in various types of electrical devices where light weight and high flexibility are needed. The transition metal oxide nanoparticles 51 may be, for example, nanoparticles of at least one transition metal oxide selected from $Fe_3O_4$, $MnO_2$, $TiO_2$, $WO_3$, $V_2O_5$, and $TiO_2$. However, the material for the transition metal oxide nanoparticles 51 is not necessarily limited to the above-mentioned materials and is in no way intended to limit the scope of the present invention.

MODE FOR CARRYING OUT THE INVENTION

A description will be given about a method for manufacturing a flexible electrode according to the present invention.

Since a flexible electrode manufactured by the method of the present invention is the same as those described in the foregoing embodiments, repeated explanation of the flexible electrode is omitted or simply provided in this description.

The method of the present invention includes a) immersing a substrate in an organic solvent including an amino group ($NH_2$)-containing monomolecular material dispersed therein to adsorb the amino group-containing monomolecular material on the substrate, and b) immersing the substrate adsorbed by the amino group-containing monomolecular material in a nonpolar solvent including metal nanoparticles dispersed therein to form a conductive layer adsorbed by the metal nanoparticles on the substrate.

In step a), a bonding layer is formed on a substrate. Specifically, an amino group-containing monomolecular material is dispersed in an organic solvent and a substrate is immersed in the dispersion. The amino group-containing monomolecular material dispersed in the solvent is adsorbed on the substrate to form a bonding layer. In the subsequent step (b), a conductive layer is formed on the bonding layer.

In step b), a nonpolar solvent including metal nanoparticles dispersed therein is prepared and the substrate formed with the bonding layer is immersed in the nonpolar solvent. As a result, the metal nanoparticles dispersed in the nonpolar solvent are immobilized by the bonding layer and ligand replacement occurs to form a conductive layer on the substrate.

Thereafter, a multilayer structure of electrode layers is formed, each of which includes a bonding layer and a conductive layer, by the following procedure. First, the substrate formed with the conductive layer in step b) is immersed in the organic solvent including the amino group-containing monomolecular material dispersed therein to adsorb the amino group-containing monomolecular material on the conductive layer. Then, the substrate adsorbed by the amino group-containing monomolecular material is immersed in the nonpolar solvent including the metal nanoparticles dispersed therein to form another conductive layer. This procedure may be repeated to form a bilayer, trilayer or higher multilayer structure of electrode layers.

When the substrate formed with the electrode layers is immersed in the organic solvent including the amino group-containing monomolecular material dispersed therein without subsequent immersion in the nonpolar solvent including the metal nanoparticles dispersed therein, a cover layer is formed on the outermost conductive layer at the most distant position from the substrate.

The flexible electrode including the outermost conductive layer is immersed in the organic solvent including the amino group-containing monomolecular material dispersed therein to form an adsorption layer containing the adsorbed amino group-containing monomolecular material. Then, the substrate formed with the adsorption layer is immersed in a nonpolar solvent including transition metal oxide nanoparticles dispersed therein to form an energy storage layer. The formation of the energy storage layer on the outermost conductive layer by coating with the transition metal oxide nanoparticles enables the use of the flexible electrode in an energy storage device.

Improved mechanical/electrical properties of the flexible electrode according to the present invention will be explained based on experimental results.

FIG. 6 shows the thicknesses of thin films with varying numbers of electrode layers in flexible electrodes according to exemplary embodiments of the present invention, FIG. 7 shows SEM images of thin films coated on different substrates in flexible electrodes according to exemplary embodiments of the present invention, FIG. 8 shows the sheet resistances of flexible electrodes according to exemplary embodiments of the present invention with varying numbers of electrode layers, FIG. 9 shows the electrical properties of flexible electrodes according to exemplary embodiments of the present invention with increasing electrode number, FIG. 10 shows the mechanical stability of flexible electrodes according to exemplary embodiments of the present invention against repeated bending, and FIG. 11 shows the UV-vis spectra absorbance values of conductive multilayers of flexible electrodes according to exemplary embodiments of the present invention.

In accordance with the method of the present invention, multilayer structures of electrode layers were formed on substrates and the thicknesses of the thin films were measured (FIG. 6). As can be seen from FIG. 6, the thickness of the thin film increased in proportion to the number of the stacked electrode layers, indicating that the method of the present invention enables stacking of the electrode layers with uniform thicknesses.

Electrode layers coated on different substrates were observed under a scanning electron microscope (SEM) (FIG. 7). (A) of FIG. 7 is a SEM image showing gold nanoparticles (Au NPs) coated on a polyester textile. The gold nanoparticles were very densely adsorbed on the fiber texture of the substrate, which is believed to be because the amino group-containing monomolecular material dispersed in the organic solvent effectively immobilizes the metal nanoparticles dispersed in the nonpolar solvent onto the substrate. (B) to (D) of FIG. 7 are images of traditional Korean paper ("Hanji" called in Korean), A4 size paper, and a polyester substrate coated before and after coating with metal nanoparticles, respectively. These images show uniform coating of the metal nanoparticles. The coating of the metal nanoparticles had no influence on the internal structure or morphology of each substrate material, and as a result, the mechanical properties of each material remained unchanged.

The sheet resistances and electrical conductivities of flexible electrodes including multilayer structures of electrode layers formed on substrates were measured (FIG. 8). As shown in (A) of FIG. 8, the sheet resistance decreased and the electrical conductivity increased with increasing number of the electrode layers. The improved electrical properties of the flexible electrodes are believed to be due to ligand replacement of the conductive layers with the amino group-containing monomolecular material. Based on these results, the flexible electrodes can achieve an electrical conductivity of $10^5$ S/cm, which corresponds to that of the bulk metal and is much higher than those of carbon materials with semiconducting properties.

Metal nanoparticles (Au NPs) were stacked on paper substrates using TREN to form multilayer structures of electrode layers ((B) of FIG. 8). Based on the results shown in (B) of FIG. 8, the flexible electrodes can achieve an electrical conductivity at a predetermined level by one-time coating of the metal nanoparticles on the substrates, indicating that the processing time can be reduced due to the high packing density of the particles. In (B) of FIG. 8, n represents the number of the electrode layers and n.5 represents the arrangement of a cover layer on the outermost electrode layer.

A comparative experiment was conducted to determine whether the use of the amino group-containing monomolecular material contributes to an improvement in the electrical properties of flexible electrodes. In this experiment, the amino group-containing monomolecular material (TREN) and a polymeric material (polyethyleneimine (PEI)) were used as linkers to immobilize metal nanoparticles. As a result, the sheet resistances of the flexible electrodes using TREN were found to be lower, as shown in (A) of FIG. 9. The electrical conductivities of the flexible electrodes using TREN were found to be higher, as shown in (B) of FIG. 9. These results can lead to the conclusion that the electrical properties of the flexible electrodes are improved when the amino group-containing monomolecular material is used compared to when the polymeric material is used.

The mechanical properties of an inventive flexible electrode were observed ((A) of FIG. 10). To this end, a 15-layer structure of electrode layers was formed on a PET substrate and a cover layer was arranged on the conductive layer of the outermost electrode layer. The resulting 15.5-layer structure was subjected to a bending test. Gold nanoparticles (Au NPs) were used as the metal nanoparticles.

As shown in (A) of FIG. 10, the electrical property of the flexible electrode was effectively maintained even after 10,000 cycles of bending test. These results are believed to be because the nanosized metal particles were densely stacked through bonding with the amino groups of TREN.

An inventive flexible electrode was manufactured by layer-by-layer assembly as a solution process and a comparative flexible electrode was manufactured by E-beam evaporation as a vapor deposition process. Both flexible electrodes were subjected to a bending test.

The results are shown in (B) of FIG. 10. As shown in (B) of FIG. 10, the inventive flexible electrode was found to have very stable mechanical properties compared to the electrode manufactured by the expensive vapor deposition process, which is currently widely used in the industry.

The absorbance values of flexible electrodes using different kinds of metal nanoparticles were measured on a UV-vis spectrophotometer. The metals were Au, Ag, and Pt (see (A), (B), and (C) of FIG. 11, respectively). This experiment was conducted to demonstrate that various metal nanoparticles other than Au nanoparticles used in the foregoing examples can be applied to the flexible electrode of the present invention. These results reveal that the scope of the present invention is not limited to Au and can be extended to other metal particles.

Although specific embodiments have been described herein, it should be understood that these embodiments are provided for illustration only and are not to be construed in any way as limiting the present invention, and that various modifications and improvements are possible by those skilled in the art without departing from the spirit and scope of the invention.

Simple modifications and variations of the present invention belong to the scope of the present invention, and the specific scope of the present invention will be clearly defined by the appended claims.

INDUSTRIAL APPLICABILITY

The flexible electrode of the present invention is manufactured by adsorbing highly electrically conductive metal nanoparticles on a human-friendly and highly flexible substrate using an amino group ($NH_2$)-containing monomolecular material to form one or more conductive layers, achieving high electrical/mechanical strength and good processability. Due to these advantages, the flexible electrode of the present invention is recognized to be industrially applicable.

The invention claimed is:

1. A flexible electrode comprising a substrate, a bonding layer formed by adsorbing an amino group ($NH_2$)-containing monomolecular material on the substrate, and a conductive layer formed by coating metal nanoparticles on the bonding layer,
   wherein the bonding layer and the conductive layer form an electrode layer and one or more electrode layers are further provided.

2. The flexible electrode according to claim 1, wherein the substrate is made of at least one material selected from polyesters, celluloses, nylons, and acrylic fibers.

3. The flexible electrode according to claim 1, wherein the amino group (NH2)-containing monomolecular material is tris(2-aminoethyl)amine (TREN).

4. The flexible electrode according to claim 1, wherein the metal nanoparticles are nanoparticles of at least one metal selected from Pt, Au, Ag, Al, and Cu.

5. The flexible electrode according to claim 1, wherein the one of more electrode layers include an outermost conductive layer at a most distant position from the substrate, and
   wherein the flexible electrode further comprises an adsorption layer formed by adsorbing an amino group-containing monomolecular material on the outermost conductive layer and an energy storage layer formed by coating transition metal oxide nanoparticles on the adsorption layer.

6. The flexible electrode according to claim 5, wherein the transition metal oxide nanoparticles are nanoparticles of at least one transition metal oxide selected from $Fe_3O_4$, $MnO_2$, $WO_3$, $V_2O_5$, and $TiO_2$.

7. The flexible electrode according to claim 1, wherein the one of more electrode layers include an outermost conductive layer at a most distant position from the substrate, and
   wherein the flexible electrode further comprises a cover layer formed by adsorbing an amino group-containing monomolecular material on the outermost conductive layer.

8. A method for manufacturing a flexible electrode, comprising a) immersing a substrate in an organic solvent comprising an amino group ($NH_2$)-containing monomolecular material dispersed therein to adsorb the amino group-containing monomolecular material on the substrate, b) immersing the substrate having the amino group-containing monomolecular material adsorbed thereon in a nonpolar solvent comprising metal nanoparticles dispersed therein to form a conductive layer of metal nanoparticles adsorbed on the substrate, c) immersing the substrate formed with the conductive layer in the organic solvent comprising the amino group-containing monomolecular material dispersed therein to adsorb the amino group-containing monomolecular material on the conductive layer, and d) immersing the substrate having the amino group-containing monomolecular material adsorbed thereon in the nonpolar solvent comprising the metal nanoparticles dispersed therein to form another conductive layer.

9. The method according to claim 8, further comprising immersing the substrate formed with the another conductive layer in the organic solvent comprising the amino group-containing monomolecular material dispersed therein to adsorb the amino group containing monomolecular material on the another conductive layer and immersing the substrate having the amino group-containing monomolecular material adsorbed thereon in a nonpolar solvent comprising transition metal oxide nanoparticles dispersed therein to adsorb the transition metal oxide nanoparticles on the another conductive layer.

10. The method according to claim 9, wherein the transition metal oxide nanoparticles are nanoparticles of at least one transition metal oxide selected from $Fe_3O_4$, $MnO_2$, $WO_3$, $V_2O_5$, and $TiO_2$.

11. The method according to claim 8, wherein the substrate is made of at least one material selected from polyesters, celluloses, nylons, and acrylic fibers.

12. The method according to claim 8, wherein the amino group (NH2)-containing monomolecular material comprises tris(2-aminoethyl)amine (TREN).

13. The method according to claim 8, wherein the metal nanoparticles are nanoparticles of at least one metal selected from Pt, Au, Ag, Al, and Cu.

* * * * *